(12) United States Patent
Kendzia, III et al.

(10) Patent No.: US 11,488,927 B2
(45) Date of Patent: Nov. 1, 2022

(54) PRESS-PACK SEMICONDUCTOR FIXTURES (71) Applicant: ABB Schweiz AG, Baden (CH)

(72) Inventors: Thomas Kendzia, III, Rockville, VA (US); Gilbert Taylor Miller, Henrico, VA (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/178,687

(22) Filed: Feb. 18, 2021

(65) Prior Publication Data

US 2022/0262763 A1 Aug. 18, 2022

(51) Int. Cl.
- H01L 23/00 (2006.01)
- H01L 21/50 (2006.01)
- H01L 23/051 (2006.01)

(52) U.S. Cl.
CPC .............. *H01L 24/72* (2013.01); *H01L 21/50* (2013.01); *H01L 23/051* (2013.01)

(58) Field of Classification Search
USPC ........................................................ 257/688
See application file for complete search history.

(56) References Cited

U.S. PATENT DOCUMENTS

| | | |
|---|---|---|
| 3,812,557 A | 5/1974 | Meyer |
| 3,943,426 A | 3/1976 | Thiele |
| 4,029,141 A | 6/1977 | Ferrari |
| 4,224,663 A | 9/1980 | Maiese |
| 4,733,331 A | 3/1988 | Chauvet |
| 5,168,425 A | 12/1992 | Radack, Jr. |
| 5,278,434 A | 1/1994 | Niwayama |
| 5,413,167 A | 5/1995 | Hara |
| 5,651,414 A | 7/1997 | Suzuki |
| 6,081,427 A | 6/2000 | Miller |
| 6,532,154 B2 | 3/2003 | Eady |
| 2002/0005578 A1 | 1/2002 | Kodama |
| 2014/0313642 A1* | 10/2014 | Zhang ...................... H02B 1/56 29/25.01 |
| 2017/0112012 A1* | 4/2017 | Powers ................. G01M 99/00 |

FOREIGN PATENT DOCUMENTS

| | | |
|---|---|---|
| CA | 959545 | 12/1974 |
| CN | 103745975 | 4/2014 |
| CN | 105632996 | 6/2016 |
| CN | 108428683 | 8/2018 |

(Continued)

OTHER PUBLICATIONS

International Search Report and Written Opinion; issued by the European Patent Office; regarding the corresponding patent application Serial No. PCT/IB2022/000072; dated Jun. 24, 2022; 10 pages.

*Primary Examiner* — Ajay Arora
(74) *Attorney, Agent, or Firm* — Greenberg Traurig, LLP (57) ABSTRACT

A press-pack semiconductor fixture 200 includes a housing defining an interior passage. A first conductor and a second conductor are mechanically coupled with the housing. The mechanical coupling of the first conductor and the second conductor with the housing is effective to apply a clamping force to a press pack semiconductor. A number of apertures or openings are provided in the housing, the first conductor, and the second conductor to permit fluidic flow 290 between the interior passage 239 and spaces or structures exterior to the housing.

20 Claims, 6 Drawing Sheets

(56) References Cited

FOREIGN PATENT DOCUMENTS

| | | |
|---|---|---|
| CN | 109300867 | 8/2020 |
| DE | 2417106 | 10/1975 |
| DE | 24060631 | 7/1976 |
| DE | 203813 | 8/1977 |
| EP | 15578 | 9/1980 |
| EP | 692822 | 1/1996 |
| EP | 2161745 A1 | 3/2010 |
| EP | 2528092 | 11/2012 |
| EP | 3018709 A1 | 5/2016 |
| GB | 2043495 | 10/1980 |
| GB | 2046990 | 11/1980 |
| JP | S57166062 A | 10/1982 |
| WO | 2007074289 | 7/2007 |
| WO | 2017050189 | 3/2017 |

\* cited by examiner

PRESS-PACK SEMICONDUCTOR FIXTURES

TECHNICAL FIELD

The present application relates to fixtures for semiconductor device(s) provided in press-pack-type packaging, also sometimes referred to as press-pack semiconductor(s), press-pack semiconductor device(s), or press-pack semiconductor package(s) or packaging, as well as to apparatuses, methods, systems, and techniques relating thereto.

BACKGROUND

Press-pack semiconductors may be utilized in a number of electrical power applications including, for example, multi-level converters or inverters, frequency converters, high-voltage inverters and converters, medium-voltage inverters and converters, other types of inverters and converters, current source systems, static VAR compensators, medium voltage alternating current (MVAC) systems and components and devices thereof, medium voltage direct current (MVDC) systems and components and devices thereof, high-voltage direct current (HVDC) systems and components and devices thereof, flexible alternating current transmission systems (FACTS) systems and components and devices thereof, as well as other electrical power systems and components thereof. Press-pack semiconductors may be preferred over other semiconductor packaging solutions (e.g., board or other surface mount, carrier or socket mount, through-hole mount, static-force casing or potting, or other conventional packaging solutions) in applications that benefit from or require high heat dissipation, high reliability, short-failure modes, electrical or mechanical series connections, topologies in which open circuits are unacceptable or undesired, or other characteristics associated with press-pack semiconductors. A number of fixtures have been proposed for press-pack semiconductors. Such proposals suffer from a number of disadvantages, drawbacks, shortcomings, and unmet needs. There remains a significant unmet need for the unique apparatuses, methods, and systems disclosed herein.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some example embodiments are apparatuses including one or more press-pack semiconductor fixtures. Some example embodiments are systems including one or more press-pack semiconductor fixtures. Some example embodiments are methods of providing one or more press-pack semiconductors in one or more respective press-pack semiconductor fixtures. Further embodiments, forms, objects, features, advantages, aspects, and benefits shall become apparent from the following description and drawings.

DETAILED DESCRIPTION OF EXAMPLE EMBODIMENTS

Figure 1:
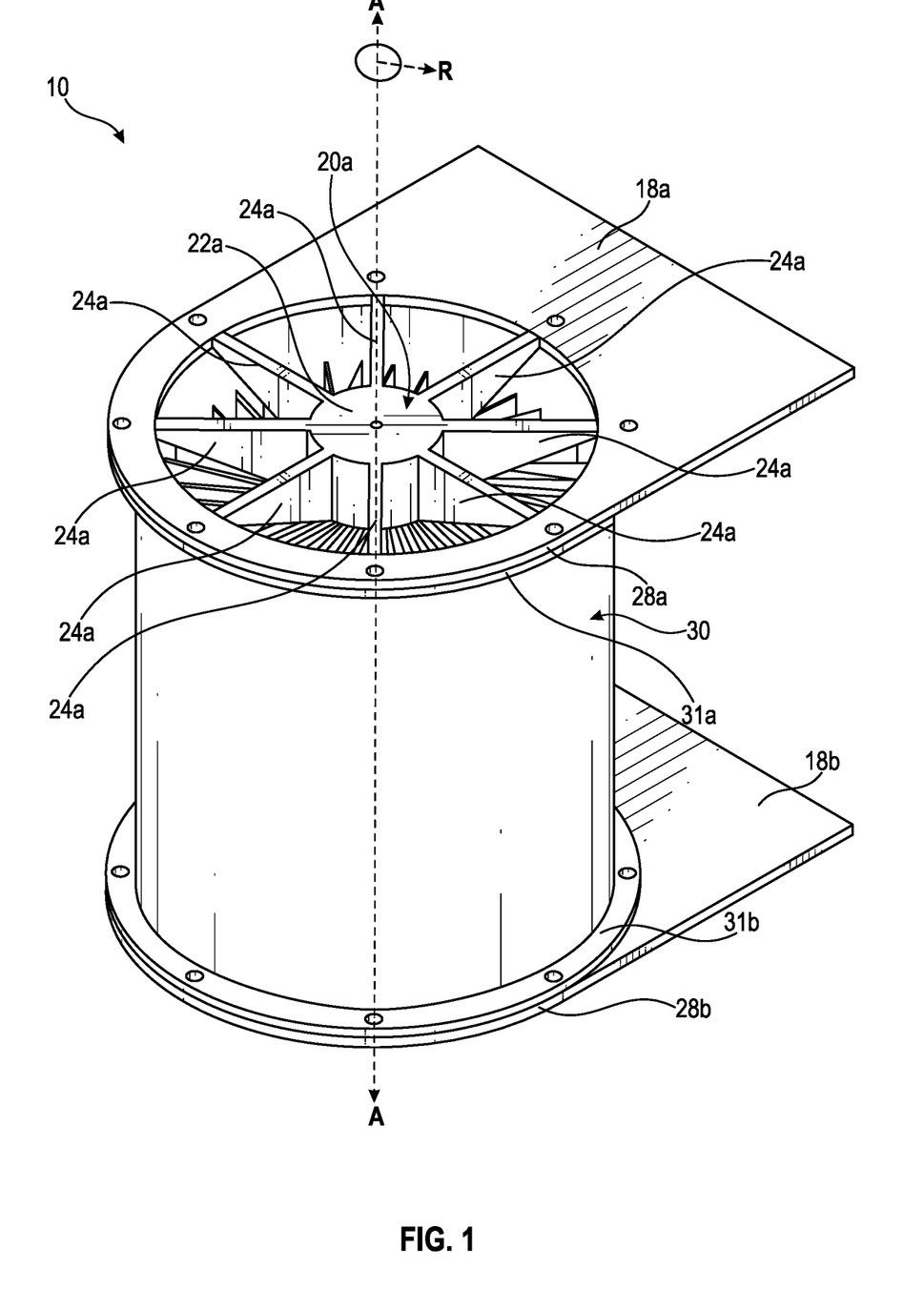
FIG. 1 is a perspective view of an example apparatus comprising a press-pack semiconductor fixture.
Figure 2:
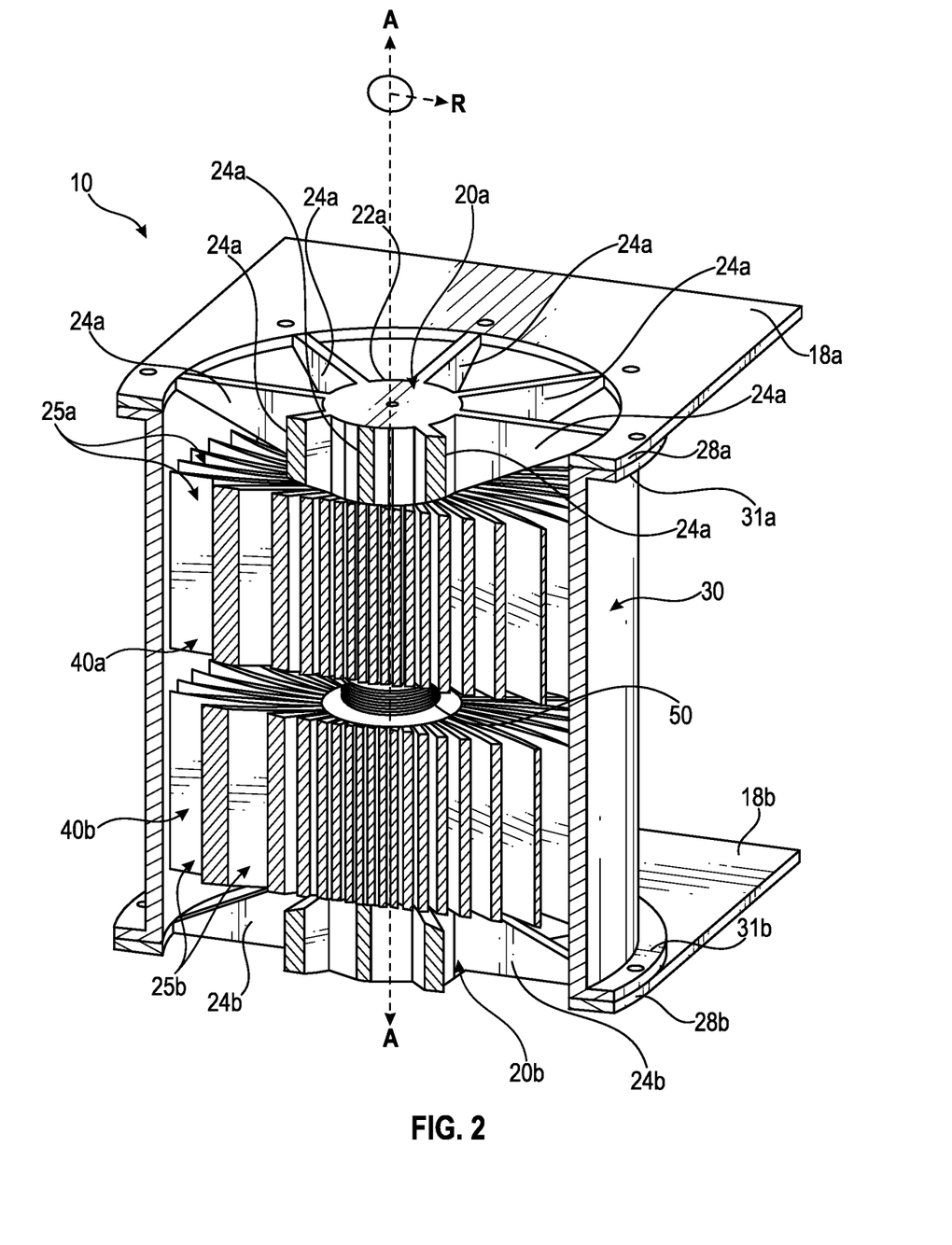
FIG. 2 is a perspective sectional view of the example apparatus of FIG. 1.
Figure 3:
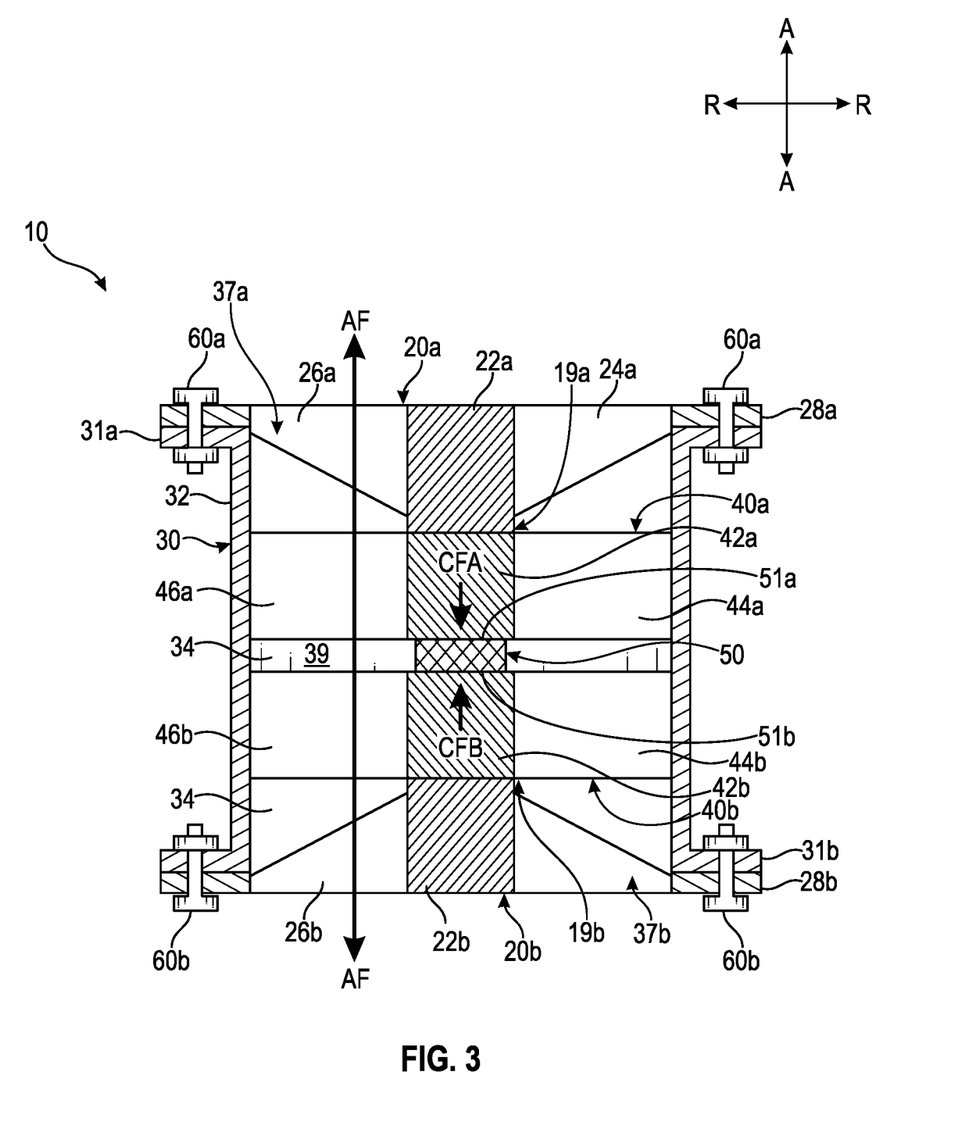
FIG. 3 is a side sectional view of the example apparatus of FIG. 1.

Referring now to the drawings and with initial reference to FIGS. 1-3, there are illustrated several views of an example apparatus including a press-pack semiconductor fixture 10 (also referred to herein as fixture 10). In FIGS. 1-3, the fixture 10 is illustrated relative to a coordinate system including an axial direction (indicated by arrow A) and a radial direction (indicated by arrow R). It shall be appreciated that the illustrated coordinate system is but one example and that structures of the illustrated embodiment and other embodiments of the fixture 10 may also extend dimensionally relative to other coordinate systems such as Cartesian or X-Y-Z coordinate systems, spherical coordinate systems, or various other coordinate systems as may be selected as convenient reference standards for various embodiments and forms of the fixture 10.

Figure 4:
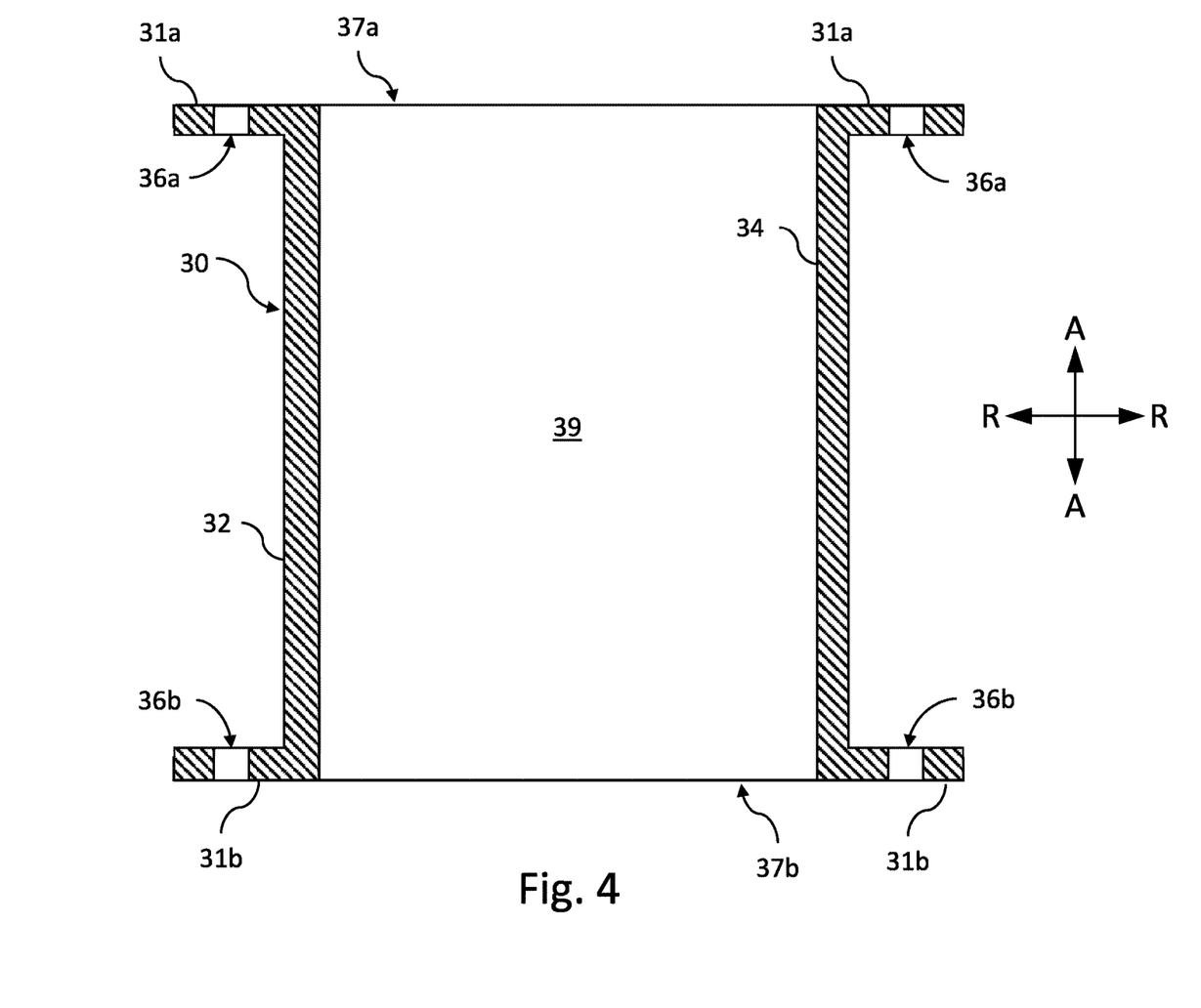
FIG. 4 is a side sectional view of a portion of the example apparatus of FIG. 1.

The fixture 10 comprises a housing 30 (also illustrated in isolation in FIG. 4) which defines an interior passage 39 comprising a hollow interior space at least partially bounded, enclosed, or surrounded by the housing 30. The housing 30 defines and extends between an opening 37*a* and an opening 37*b* which lead to (or from) the interior passage 39 and provide fluidic communication between the interior passage 39 and ambient space or structures external to the housing 30. The housing 30 includes and extends between least one exterior surface 32 and at least one interior surface 34 which at least in part defines the interior passage 39. A flange 31*a* is provided at a first axial location along the housing 30*a*. A plurality of apertures 36*a* are defined in the flange 31*a* and are configured to receive respective fasteners 60*a*. A flange 31*b* is provided at a second axial location along the housing 30. A plurality of apertures 36*b* are defined in the flange 31*b* and are configured to receive respective fasteners 60*b*.

In the illustrated example, the flange 31*a* and the flange 31*b* extend radially beyond the exterior surface and are generally aligned with the opening 37*a* and the opening 37*b*, respectively. In other embodiment, the flange 31*a* and the flange 31*b* may extend in directions and/or distances differing from those of the illustrated example. In other embodiments, other portions or structures of the housing 30 may be configured to receive the fasteners 60*a* and the fasteners 60*b* including, for example, end surfaces, side surfaces, and other types of projections or terminus structures.

In the illustrated embodiment, the housing 30 is formed of one or more electrically insulating materials. Examples of electrically insulating materials which may be utilized in connection with the housing 30 include glass fiber reinforced thermoset polyester (e.g., GPO-3), ultra-high molecular weight (UHMW) polyethylene, ceramic materials such as porcelain or Aluminum-based ceramics (e.g., $Al_2O_3$), and other materials as will occur to those of skill in the art with the benefit of the present disclosure. In some preferred forms, the housing 30 comprises one or more electrically insulating materials either alone or in combination with one or more other materials which are not necessarily electrically insulating and which may be electrically conductive. In some preferred forms, the housing 30 consists essentially of one or more electrically insulating materials. In some preferred forms, the housing 30 consists of one or more electrically insulating materials.

In the illustrated embodiment, the housing 30 comprises a generally cylindrical shape and a generally round cross-section, and includes the opening 37a and the opening 37b positioned at opposing ends of the housing 30. The housing 30 may in principle comprise or be provided in a number of structural arrangements, forms, and geometries which impart or have structural rigidity and strength (e.g., net compressive, tensile, or flexion characteristics) to facilitate application of clamping forces to a press pack semiconductor in combination with the other structures of the fixture 10 and, aside from this structural characteristic, need not be restricted or limited to a particular arrangement, form, geometry, material, or composition.

The fixture 10 includes an electrical conductor 19a which is configured to contact a first surface 51a of the press-pack semiconductor 50. The electrical conductor 19a is configured to conductively coupled the press-pack semiconductor 50 with a terminal 18a positioned outside the interior passage 39 via a conductive pathway extending through the opening 37a. In the illustrated example, the terminal 18a is configured as a blade-type terminal comprising a conductive flange extending from the housing 30 and configured to operatively couple with a mating or receiving connector structure of an electrical power device or system. In other embodiment, the terminal 18a may be provided in other forms including, for example, bolt-type terminals, clamp-type terminals, plug-type terminals, socket-type terminals, and other types of electrical connectors or terminals.

In the illustrated embodiment, the electrical conductor 19a comprises a clamp member 20a and a heat exchanger 40a. The clamp member 20a is mechanically coupled with the housing 30 by a plurality of fasteners 60a. The clamp member 20a mechanically interfaces with the housing 30 and with the heat exchanger 40a to provide a first mechanical clamping force component (generally indicated by arrow CFA) to the first surface 51a of press-pack semiconductor 50. Such mechanical clamping force may be provided solely by affixation, coupling, or fastening of the electrical conductor 19a to the housing 30 via one or more devices and/or interfaces (referred to herein as fasteners) and need not require additional structures or couplings with additional structures. In the illustrated embodiment, the electrical conductor 19a is provided in a multi-component form wherein the clamp member 20a and the heat exchanger 40a comprise discrete components. In other embodiment, the electrical conductor 19a may be provided in other multi-component forms including different numbers of discrete components. In other embodiment, the electrical conductor 19a may be provided in unitary forms including a single unitary component rather than multiple discrete components.

In the illustrated embodiment, the clamp member 20a comprises a hub 22a, a rim 28a, and a plurality of spokes 24a extending radially between the hub 22a and the rim 28a. The hub 22a, the rim 28a, and the plurality of spokes 24a define a plurality of airflow passages 25a (only several of which are labeled to preserve clarity of the drawings) in fluidic communication with the opening 37a. The plurality of spokes 24a also provide corresponding heat exchange surfaces 26a. The terminal 18a extends radially from the rim 28a in the illustrated embodiment but may additionally or alternatively extend in various other directions and to various other extents in other embodiments. The rim 28a mechanically interfaces with the flange 31a of the housing 30. A plurality of apertures 63a are defined in the rim 28a and are generally operatively aligned with corresponding ones of the plurality of apertures 36a of the housing. A plurality of fasteners 60a extend through respective pairs of the apertures 36a, 63a and impart a clamping force which urges the rim 28a and the flange 31a toward one another applies the mechanical clamping force component CFA to the first surface 51a of press-pack semiconductor 50.

It shall be appreciated that, in other embodiments, the clamp member 20a a may be provided in a number of other configurations and forms. For example, the hub 22a, the rim 28a, and the plurality of spokes 24a may be provided with different geometries and may extend in different directions and to different degrees or lengths than those of the illustrated example. Furthermore, additional and alternate structures than the hub 22b, the rim 28b, and the plurality of spokes 24b may be provided in other embodiments, for example, bowl-shaped, dome-shaped, plate-shaped, or other structures including or defining one or more airflow passages providing fluidic communication to the interior passage 39 may be utilized.

It shall be appreciated that each of the fasteners 60a is an example of a fastener mechanically coupled with a housing wherein the mechanical coupling of the fastener and the housing is effective to apply a first force to the first surface of a press-pack semiconductor via a conductor. In the illustrated example, the fasteners 60a are provided as nut and bolt-type fasteners. Other embodiments may additionally or alternatively comprise a number of other types of fasteners including, for example, clamps, interference-fit fasteners, screws, shims, rivets, to name several examples.

The heat exchanger 40a comprises a base 42a and a plurality of fins 44a extending from the base 42 into the interior passage 39. The base 42a provides electrical conduction and transfer of the mechanical clamping force component CFA between the clamp member 20a and the first surface 51a of press-pack semiconductor 50. The plurality of fins 44a provide additional surface areas 46a for heat transfer from the heat exchanger 40a to the interior passage 39 and fluid such as cooling air provided or flowing through the interior passage 39. In some forms, the cooling air or other fluid may be actively circulated through the interior passage 39, for example by a fan, impeller, or pump. In some forms, the cooling air or other fluid may be passively circulated through the interior passage 39, for example, by ambient airflow, effects of thermal gradients, or other passive phenomena.

In the illustrated embodiment, the base 42 is centrally positioned and the plurality of fins 44a extend radially outward from the base 42a toward the at least one interior surface 34 of the housing 30. One or more of the plurality of fins 44a may contact the at least one interior surface 34 or a clearance gap may be provided therebetween. Other embodiments may include fins which extend in different directions or to different extents than the illustrated example. Furthermore, other embodiment may include different heat exchanger structures with surface areas for heat transfer from the heat exchanger 40a to the interior passage 39 and fluid such as cooling air provided or flowing through the interior passage 39.

The fixture 10 can receive and operatively electrically and mechanically couple with a press-pack semiconductor 50 which is disposed in the housing 30 and occupies a portion of the interior passage 39. The press-pack semiconductor 50 may be provided in a number of forms which include a package, such as a container, enclosure, or housing, which contains, encloses, houses, or otherwise retains one or more semiconductor devices disposed intermediate at least two conductors which are exposed to or otherwise electrically accessible from the exterior of the package, and which is configured, structured, and/or rated for a compressive force to be applied to the package to enhance, establish, maintain, and/or secure an electrical and/or mechanical connection between the at least two conductors and the one or more semiconductor devices.

The one or more semiconductor devices may be of a number of types including, for example, fast recovery diodes, rectifier diodes, welding diodes, other types of diodes, insulated gate bipolar transistors (IGBT), injection-enhanced gate transistors (IEGT), silicon controlled rectifiers (SCR), gate turn-off thyristors (GTO), integrated gate-commutated thyristors (IGCT), phase control thyristors (PCT), bi-directionally controlled thyristors (BCT), other types of thyristors, other types of semiconductor devices, or combinations of the foregoing. The package and the press-pack semiconductor 50 may be provided in a number of form factors including, for example, cylindrical or puck-shaped form factors, rectilinear form factors, and other form factors.

The fixture 10 includes an electrical conductor 19b which is configured to contact a second surface 51b of the press-pack semiconductor 50. The electrical conductor 19b is configured to conductively coupled the press-pack semiconductor 50 with a terminal 18b positioned outside the interior passage 39 via a conductive pathway extending through the opening 37b. In the illustrated example, the terminal 18b is configured as a blade-type terminal comprising a conductive flange extending from the housing 30 and configured to operatively couple with a mating or receiving connector structure of an electrical power device or system. In other embodiment, the terminal 18b may be provided in other forms including, for example, bolt-type terminals, clamp-type terminals, plug-type terminals, socket-type terminals, and other types of electrical connectors or terminals.

In the illustrated embodiment, the electrical conductor 19b comprises a clamp member 20b and a heat exchanger 40b. The clamp member 20b is mechanically coupled with the housing 30 by a plurality of fasteners 60a. The clamp member 20b mechanically interfaces with the housing 30 and with the heat exchanger 40b to provide a second mechanical clamping force component (generally indicated by arrow CFB) to the second surface 51b of press-pack semiconductor 50. Such mechanical clamping force may be provided solely by affixation, coupling, or fastening of the electrical conductor 19b to the housing 30 via one or more devices and/or interfaces (referred to herein as fasteners) and need not require additional structures or couplings with additional structures. In the illustrated embodiment, the electrical conductor 19b is provided in a multi-component form wherein the clamp member 20b and the heat exchanger 40b comprise discrete components. In other embodiment, the electrical conductor 19b may be provided in other multi-component forms including different numbers of discrete components. In other embodiment, the electrical conductor 19b may be provided in unitary forms including a single unitary component rather than multiple discrete components.

In the illustrated embodiment, the clamp member 20b comprises a hub 22b, a rim 28b, and a plurality of spokes 24b extending radially between the hub 22b and the rim 28a. The hub 22b, the rim 28b, and the plurality of spokes 24b define a plurality of airflow passages 25b (only several of which are labeled to preserve clarity of the drawings) in fluidic communication with the opening 37a. The plurality of spokes 24b also provide corresponding heat exchange surfaces 26b. The terminal 18b extends radially from the rim 28b in the illustrated embodiment but may additionally or alternatively extend in various other directions and to various other extents in other embodiments. The rim 28b mechanically interfaces with the flange 31b of the housing 30. A plurality of apertures 63b are defined in the rim 28b and are generally operatively aligned with corresponding ones of the plurality of apertures 36b of the housing. A plurality of fasteners 60b extend through respective pairs of the apertures 36b, 63b and impart a clamping force which urges the rim 28b and the flange 31b toward one another applies the mechanical clamping force component CFB between the second surface 51b of press-pack semiconductor 50.

It shall be appreciated that, in other embodiments, the clamp member 20b a may be provided in a number of other configurations and forms. For example, the hub 22b, the rim 28b, and the plurality of spokes 24b may be provided with different geometries and may extend in different directions and to different degrees or lengths than those of the illustrated example. Furthermore, additional and alternate structures than the hub 22a, the rim 28a, and the plurality of spokes 24a may be provided in other embodiments, for example, bowl-shaped, dome-shaped, plate-shaped, or other structures including or defining one or more airflow passages providing fluidic communication to the interior passage 39 may be utilized.

It shall be appreciated that each of the fasteners 60b is an example of a fastener mechanically coupled with a housing wherein the mechanical coupling of the fastener and the housing is effective to apply a second force to the second surface of a press-pack semiconductor via a conductor. In the illustrated example, the fasteners 60b are provided as nut and bolt-type fasteners. Other embodiments may additionally or alternatively comprise a number of other types of fasteners including, for example, clamps, interference-fit fasteners, screws, shims, rivets, to name several examples.

The heat exchanger 40b comprises a base 42b and a plurality of fins 44b extending from the base 42 into the interior passage 39. The base 42b provides electrical conduction and transfer of the mechanical clamping force component CFB between the clamp member 20b and the second surface 51b of press-pack semiconductor 50. The plurality of fins 44b provide additional surface areas 46b for heat transfer from the heat exchanger 40b to the interior passage 39 and fluid such as cooling air provided or flowing through the interior passage 39. In some forms, the cooling air or other fluid may be actively circulated through the interior passage 39, for example by a fan, impeller, or pump. In some forms, the cooling air or other fluid may be passively circulated through the interior passage 39, for example, by ambient airflow, effects of thermal gradients, or other passive phenomena.

In the illustrated embodiment, the base 42 is centrally positioned and the plurality of fins 44b extend radially outward from the base 42b toward the at least one interior surface 34 of the housing 30. One or more of the plurality of fins 44*b* may contact the at least one interior surface 34 or a clearance gap may be provided therebetween. Other embodiments may include fins which extend in different directions or to different extents than the illustrated example. Furthermore, other embodiment may include different heat exchanger structures with surface areas for heat transfer from the heat exchanger 40*b* to the interior passage 39 and fluid such as cooling air provided or flowing through the interior passage 39.

Figure 5:
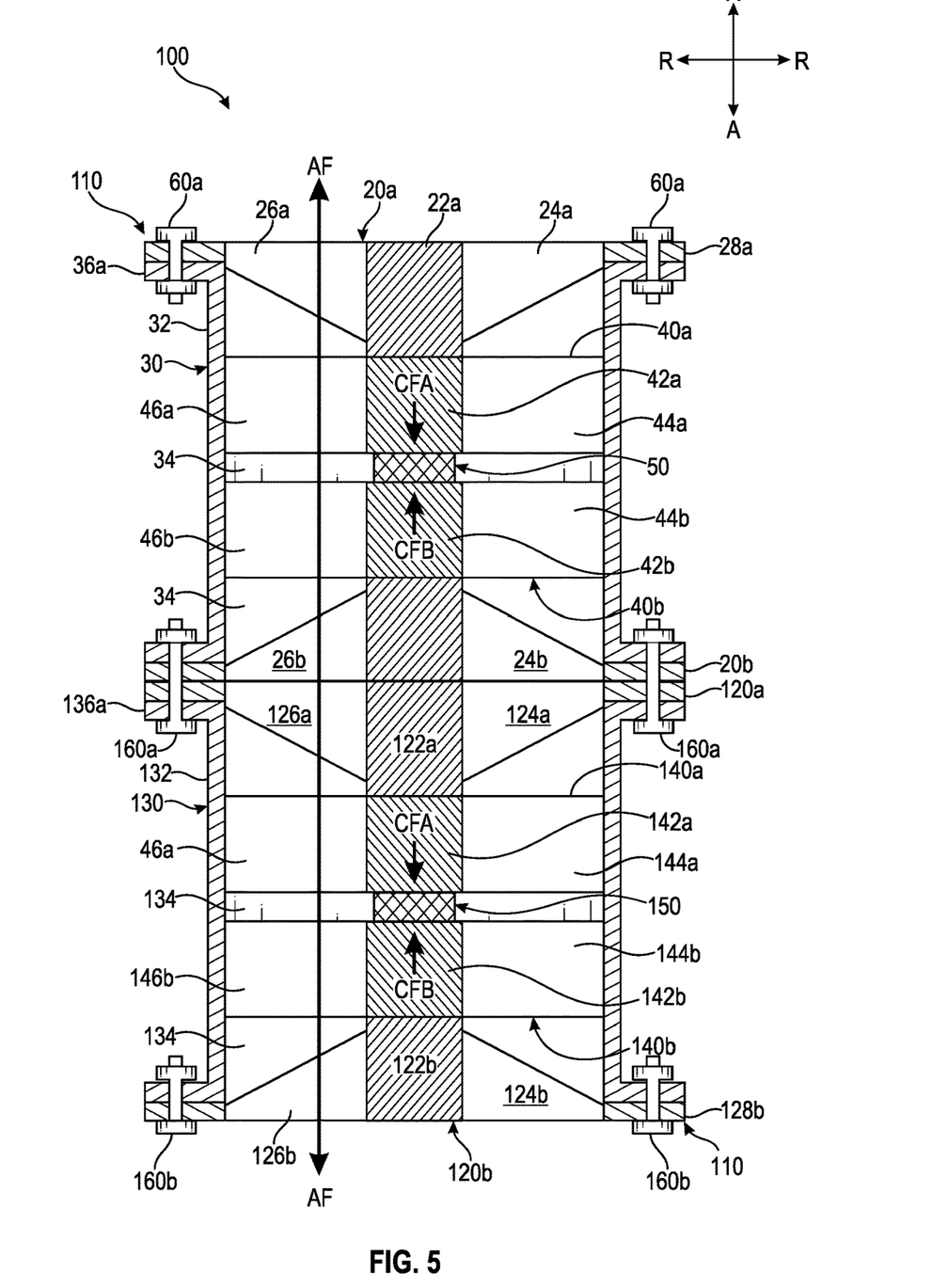
FIG. 5 is a side sectional view of an example apparatus including a plurality of press-pack semiconductor fixtures.

With reference to FIG. 5, there is illustrated an example apparatus 100 including multiple press-pack semiconductor fixtures. The apparatus 100 includes a first fixture 110 including a number of features which the same as or substantially similar to those of the fixture 10. The apparatus 100 includes a second fixture 110 including a number of features which the same as or substantially similar to those of the fixture 10, but with reference numerals incremented by 100. It shall be appreciated that description provided in connection with FIGS. 1-4 applies, mutatis mutandis, to the first fixture 10 and the second fixture 110 of the example apparatus 100, and such description is incorporated herein in the interest of concise disclosure.

The first fixture 110 and the second fixture 111 also differ from the fixture 10 in a number of respects. The first fixture 110 mechanically interfaces and is coupled with the second fixture 111 by a plurality of fasteners 160*a* which extend through apertures defined in the flange 31*b*, the rim 28*b*, the flange 131*a*, and the rim 128*a* which apertures are generally aligned with one another. The clamp member 20*b* and the clamp member 120*a* also mechanically interface with and are coupled with one another by the fasteners 160. This mechanical interface and coupling contributes to the first mechanical clamping force component CFA and the second mechanical clamping force component CFB applied, respectively, to the first surface 51*a* and the second surface 51*b* of the press-pack semiconductor 50, as well as to the third mechanical clamping force component CFC and the fourth mechanical clamping force component CFD applied, respectively, to the first surface 151*a* and the second surface 151*b* of the press-pack semiconductor 150.

Figure 6:
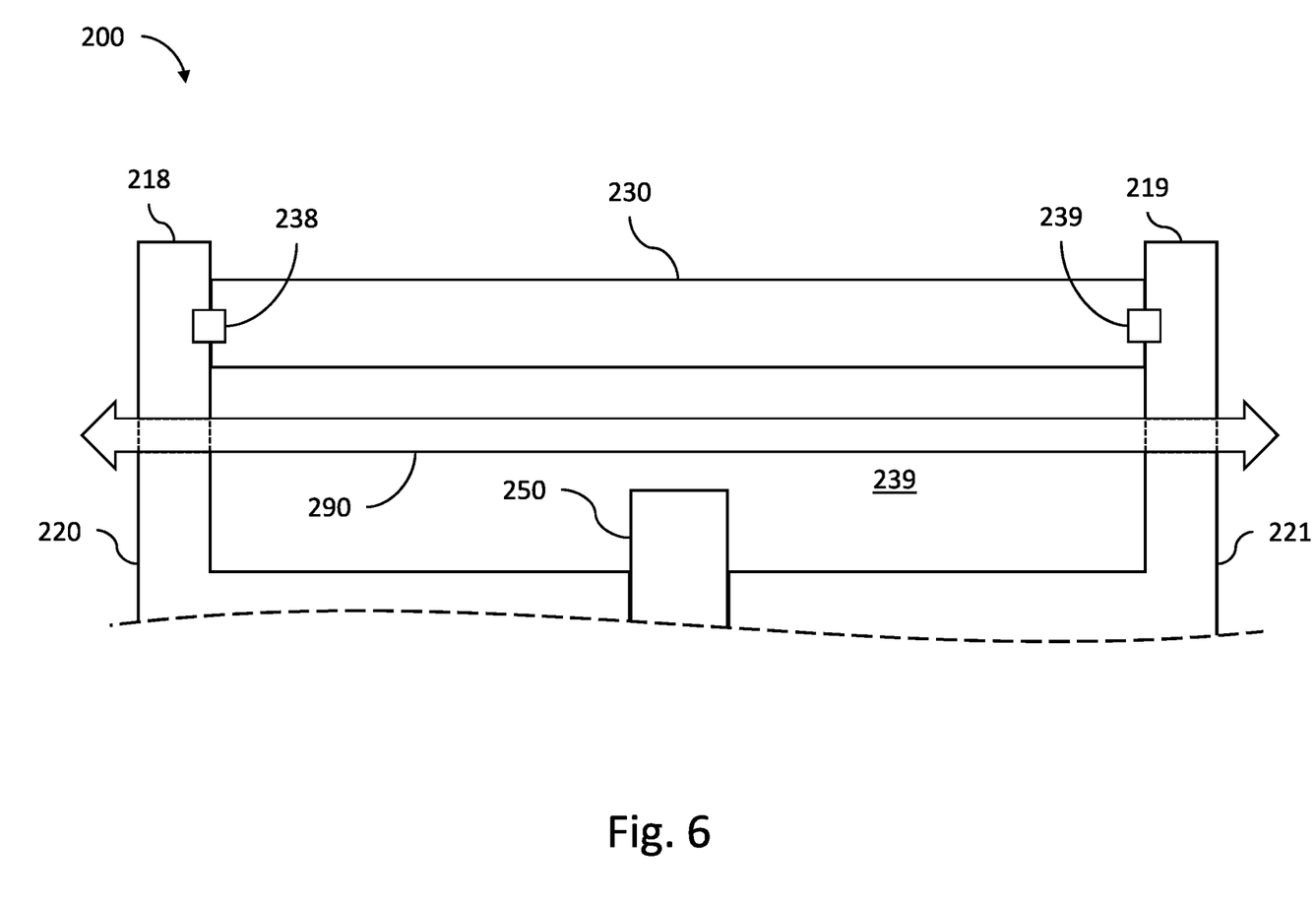
FIG. 6 is a schematic view of another example apparatus comprising a press-pack semiconductor fixture.

With reference to FIG. 6, there is illustrated a schematic view of an example apparatus including a press-pack semiconductor fixture 200 (also referred to herein as fixture 200). The fixture 200 includes a housing 230 which defines an interior passage 239 comprising a hollow interior space at least partially bounded, enclosed, or surrounded by the housing 230. A conductor 220 is mechanically coupled with the housing 230 by a fastener 218. A conductor 221 is mechanically coupled with the housing 230 by a fastener 219. The mechanically coupling of the conductor 220 and the conductor 221 with the housing by the fastener 218 and the fastener 219 is effective to apply a clamping force to a press pack semiconductor 250. A number of apertures or openings are provided in the housing 230, the conductor 220, and the conductor 221 to permit fluidic flow 290 between the interior passage 239 and spaces or structures exterior to the housing.

The schematic depiction of FIG. 6 shall be understood to indicate the breadth and variety of structural forms and features that may be provided or present in press-pack semiconductor fixtures according to the present disclosure. A number of alternatives and additions to the embodiments of FIGS. 1-5 are noted in the description thereof and are incorporated with respect to the fixture 200 in the interest of concise disclosure. A number of further alternatives and additions shall be described in connection with the fixture 200 and shall be understood to apply, mutatis mutandis, to the embodiments of FIGS. 1-5, a number In some embodiments, one of the conductor 220 and the conductor 221 may be retained against the housing by a fastener comprising an interface threbetween. For example, such a fastener may include mechanical interfacing of respective surface achieved by inserting a conductor into the interior passage 139 and advancing the conductor until it contacts an abutment surface, such as an internally extending flange or other structure of the housing 230.

In some embodiment, the housing 230 may include more than two openings, for example, the housing 230 may include more than two openings accommodating additional fluidic flow paths. Similarly, the conductor 220 and the conductor 221 may include any number of apertures or openings accommodating corresponding numbers of fluidic flow paths leading to or from the interior passage.

It shall be appreciated that the present disclosure contemplates multiple embodiments and multiple forms thereof, including the following examples. A first example embodiment is an apparatus comprising: a housing extending between a first opening and a second opening, defining an interior passage, and comprising an electrical insulator; a press-pack semiconductor disposed in the interior passage; a first electrical conductor contacting a first surface of the press-pack semiconductor and via the first opening conductively coupling the press-pack semiconductor with a first terminal positioned outside the interior passage; a second electrical conductor contacting a second surface of the press-pack semiconductor and via the second opening conductively coupling the press-pack semiconductor with a second terminal positioned outside the interior passage; an airflow passage extending through the interior passage between the first opening and the second opening and being bounded at least in part by the housing, the first electrical conductor, and the second electrical conductor; a first fastener mechanically coupled with the housing and the first electrical conductor, the mechanical coupling of the first fastener and the housing applying a first force to the first surface of the press-pack semiconductor via the first conductor; and a second fastener mechanically coupled with the housing and the second electrical conductor, the mechanical coupling of the second fastener and the housing applying a second force to the second surface of the press-pack semiconductor via the second conductor, the press-pack semiconductor being under compression by at least the first force and the second force. In some forms of the first example embodiment, at least one of: (a) the first conductor comprises a first clamp member mechanically coupled with the housing at least in part by the first fastener and a first heat exchanger positioned intermediate and conductively coupling the first clamp member and the press-pack semiconductor, and (b) the second conductor comprises a second clamp member mechanically coupled with the housing at least in part by the second fastener and a second heat exchanger positioned intermediate and conductively coupling the second clamp member and the press-pack semiconductor. In some forms of the first example embodiment, at least one of: (a) the first clamp member and the first heat exchanger are provided as discrete components, and (b) the second clamp member and the second heat exchanger are provided as discrete components. In some forms of the first example embodiment, at least one of: (a) the first heat exchanger includes a first surface contacting and receiving the first force from the first clamp member and a second surface contacting and applying the first force to the press-pack semiconductor, and (b) the second heat exchanger includes a first surface contacting and receiving the second force from the second clamp member and a second surface contacting and applying the second force to the press-pack semiconductor. In some forms of the first example embodiment, at least one of: (a) the first heat exchanger comprises a first base and one or more fins extending from the base into the interior passage, and (b) the second heat exchanger comprises a second base and one or more fins extending from the second base into the interior passage. In some forms of the first example embodiment, the first force is provided entirely by mechanical coupling of the first electrical conductor with the housing, and the second force is provided entirely by mechanical coupling of the second electrical conductor with the housing. In some forms of the first example embodiment, mechanical coupling of the first electrical conductor with the housing is provided entirely by a first set of one or more fasteners including the first fastener applying fastening force only the first conductor and the housing, and mechanical coupling of the second electrical conductor with the housing is provided entirely by a second set of one or more fasteners including the second fastener applying fastening force only the second conductor and the housing. In some forms of the first example embodiment, the housing comprises a cylindrical shape. In some forms of the first example embodiment, the first opening and the second opening are positioned at opposing ends of the cylindrical shape. In some forms of the first example embodiment, the cylindrical shape comprises a round axial cross-section.

A second example embodiment is an apparatus comprising: press-pack semiconductor fixture including a housing extending between a first opening and a second opening and defining an interior passage; a first electrical conductor extending through the first opening and conductively coupling a first terminal positioned outside the interior passage and first planar contact surface disposed in the interior passage, the first planar contact surface being configured to contact and conductively coupled with a press-pack semiconductor; a second electrical conductor extending through the second opening and conductively coupling a second terminal positioned outside the interior passage and second planar contact surface disposed in the interior passage, the second planar contact surface being configured to contact and conductively coupled with a press-pack semiconductor; a first fastener mechanically coupling the housing and the first electrical conductor, the mechanical coupling applying a first force to the first conductor urging the first conductor into the interior passage; and a second fastener mechanically coupling the housing and the second electrical conductor, the mechanical coupling applying a second force to the second conductor urging the second conductor into the interior passage, the second force being at least partially in opposition to the first force; wherein an interior surface of the housing, the first electrical conductor, and the second electrical conductor at least partially define a fluid flow passage extending through the interior passage. In some forms of the second example embodiment, the apparatus comprises a press-pack semiconductor contacting and conductively coupled with the first planar contact surface and the second planar contact surface. In some forms of the second example embodiment, the press-pack semiconductor is under compression by the first force urging the first conductor into the interior passage and the second force urging the second conductor into the interior passage. In some forms of the second example embodiment, the first fastener mechanically contacts and couples only the housing and the first electrical conductor. In some forms of the second example embodiment, the second fastener mechanically contacts and couples only the housing and the first electrical conductor.

A third example embodiment is a method of assembling a press pack semiconductor fixture, the method comprising: fastening a first electrical conductor to a housing such that the first electrical conductor extends through a first opening of the housing, contacts a press-pack semiconductor positioned inside the housing, and conductively couples the press-pack semiconductor with a first terminal positioned outside the housing; and fastening a second electrical conductor to the housing such that the second electrical conductor extends through a second opening of the housing, contacts the press-pack semiconductor, and conductively couples the press-pack semiconductor with a second terminal positioned outside the housing; wherein the acts of fastening the first electrical conductor to the housing and fastening the second electrical conductor to the housing apply compressive force to the press-pack semiconductor. In some forms of the third example embodiment, the acts of fastening the first electrical conductor to the housing and fastening the second electrical conductor to the housing supply the entire compressive force applied to the press-pack semiconductor. In some forms of the third example embodiment, the act of fastening the second electrical conductor to the housing comprises aligning a first set of one or more apertures defined in the housing with a second set of one or more apertures defined in the second electrical conductor and inserting one or more fasteners into one or more respective aperture pairs including an aperture of the first set and an aperture of the second set. In some forms of the third example embodiment, the act of fastening the second electrical conductor to the housing consists of bringing one or more fasteners into contact only with the housing and the second electrical conductor. In some forms of the third example embodiment, the act of fastening the first electrical conductor to the housing consists of bringing one or more fasteners into contact only with the housing and the first electrical conductor.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:
1. An apparatus comprising:
a housing extending between a first opening and a second opening, defining an interior passage, and comprising an electrical insulator;
a press-pack semiconductor disposed in the interior passage;

a first electrical conductor contacting a first surface of the press-pack semiconductor and via the first opening conductively coupling the press-pack semiconductor with a first terminal positioned outside the interior passage;

a second electrical conductor contacting a second surface of the press-pack semiconductor and via the second opening conductively coupling the press-pack semiconductor with a second terminal positioned outside the interior passage;

an airflow passage extending through the interior passage between the first opening and the second opening and being bounded at least in part by the housing, the first electrical conductor, and the second electrical conductor;

a first fastener mechanically coupled with the housing and the first electrical conductor, the mechanical coupling of the first fastener and the housing applying a first force to the first surface of the press-pack semiconductor via the first conductor; and a second fastener mechanically coupled with the housing and the second electrical conductor, the mechanical coupling of the second fastener and the housing applying a second force to the second surface of the press-pack semiconductor via the second conductor, the press-pack semiconductor being under compression by at least the first force and the second force.

2. The apparatus of claim 1, wherein at least one of:
(a) the first electrical conductor comprises a first clamp member mechanically coupled with the housing at least in part by the first fastener and a first heat exchanger positioned intermediate and conductively coupling the first clamp member and the press-pack semiconductor, and
(b) the second electrical conductor comprises a second clamp member mechanically coupled with the housing at least in part by the second fastener and a second heat exchanger positioned intermediate and conductively coupling the second clamp member and the press-pack semiconductor.

3. The apparatus of claim 2, wherein at least one of:
(a) the first clamp member and the first heat exchanger are provided as discrete components, and
(b) the second clamp member and the second heat exchanger are provided as discrete components.

4. The apparatus of claim 3 wherein at least one of:
(a) the first heat exchanger includes a first surface contacting and receiving the first force from the first clamp member and a second surface contacting and applying the first force to the press-pack semiconductor, and
(b) the second heat exchanger includes a first surface contacting and receiving the second force from the second clamp member and a second surface contacting and applying the second force to the press-pack semiconductor.

5. The apparatus of claim 2, wherein at least one of:
(a) the first heat exchanger comprises a first base and one or more fins extending from the base into the interior passage, and
(b) the second heat exchanger comprises a second base and one or more fins extending from the second base into the interior passage.

6. The apparatus of claim 1, wherein the first force is provided entirely by mechanical coupling of the first electrical conductor with the housing, and the second force is provided entirely by mechanical coupling of the second electrical conductor with the housing.

7. The apparatus of claim 1, wherein mechanical coupling of the first electrical conductor with the housing is provided entirely by a first set of one or more fasteners including the first fastener applying fastening force only the first conductor and the housing, and mechanical coupling of the second electrical conductor with the housing is provided entirely by a second set of one or more fasteners including the second fastener applying fastening force only the second conductor and the housing.

8. The apparatus of claim 1, wherein the housing comprises a cylindrical shape.

9. The apparatus of claim 8, wherein the first opening and the second opening are positioned at opposing ends of the cylindrical shape.

10. The apparatus of claim 8, wherein the cylindrical shape comprises a round axial cross-section.

11. An apparatus comprising:
a press-pack semiconductor fixture including:
a housing extending between a first opening and a second opening and defining an interior passage;
a first electrical conductor extending through the first opening and conductively coupling a first terminal positioned outside the interior passage and first planar contact surface disposed in the interior passage, the first planar contact surface being configured to contact and conductively coupled with a press-pack semiconductor;
a second electrical conductor extending through the second opening and conductively coupling a second terminal positioned outside the interior passage and second planar contact surface disposed in the interior passage, the second planar contact surface being configured to contact and conductively coupled with the press-pack semiconductor;
a first fastener mechanically coupling the housing and the first electrical conductor, the mechanical coupling applying a first force to the first conductor urging the first conductor into the interior passage; and
a second fastener mechanically coupling the housing and the second electrical conductor, the mechanical coupling applying a second force to the second conductor urging the second conductor into the interior passage, the second force being at least partially in opposition to the first force;
wherein an interior surface of the housing, the first electrical conductor, and the second electrical conductor at least partially define a fluid flow passage extending through the interior passage.

12. The apparatus of claim 11, comprising a press-pack semiconductor contacting and conductively coupled with the first planar contact surface and the second planar contact surface.

13. The apparatus of claim 12, wherein the press-pack semiconductor is under compression by the first force urging the first electrical conductor into the interior passage and the second force urging the second electrical conductor into the interior passage.

14. The apparatus of claim 11 wherein the first fastener mechanically contacts and couples only the housing and the first electrical conductor.

15. The apparatus of claim 14, wherein the second fastener mechanically contacts and couples only the housing and the first electrical conductor.

16. A method of assembling a press pack semiconductor fixture, the method comprising:

fastening a first electrical conductor to a housing such that the first electrical conductor extends through a first opening of the housing, contacts a press-pack semiconductor positioned inside the housing, and conductively couples the press-pack semiconductor with a first terminal positioned outside the housing; and fastening a second electrical conductor to the housing such that the second electrical conductor extends through a second opening of the housing, contacts the press-pack semiconductor, and conductively couples the press-pack semiconductor with a second terminal positioned outside the housing;

wherein the fastening the first electrical conductor to the housing and fastening the second electrical conductor to the housing apply compressive force to the press-pack semiconductor.

17. The method of claim 16, wherein the fastening the first electrical conductor to the housing and fastening the second electrical conductor to the housing supply the entire compressive force applied to the press-pack semiconductor.

18. The method of claim 16, wherein the fastening the second electrical conductor to the housing comprises aligning a first set of one or more apertures defined in the housing with a second set of one or more apertures defined in the second electrical conductor and inserting one or more fasteners into one or more respective aperture pairs including an aperture of the first set and an aperture of the second set.

19. The method of claim 16, wherein the fastening the second electrical conductor to the housing consists of bringing one or more fasteners into contact only with the housing and the second electrical conductor.

20. The method of claim 19, wherein the fastening the first electrical conductor to the housing consists of bringing one or more fasteners into contact only with the housing and the first electrical conductor.

* * * * *